(12) United States Patent
Ogata (10) Patent No.: US 6,778,255 B2
(45) Date of Patent: Aug. 17, 2004

(54) EXPOSURE APPARATUS

(75) Inventor: Masaru Ogata, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/975,989

(22) Filed: Oct. 15, 2001

(65) Prior Publication Data

US 2002/0051126 A1 May 2, 2002

(30) Foreign Application Priority Data

Oct. 23, 2000 (JP) ........................................ 2000-322331

(51) Int. Cl.$^7$ .......................... G03B 27/52; G03B 27/42
(52) U.S. Cl. ........................................ 355/30; 355/53
(58) Field of Search ............................. 355/30, 52, 53, 355/67–71, 77; 359/350, 355

(56) References Cited

U.S. PATENT DOCUMENTS

| | | | | |
|---|---|---|---|---|
| 4,690,528 A | * | 9/1987 | Tanimoto et al. ........... 353/101 |
| 5,243,377 A | * | 9/1993 | Umatate et al. .............. 355/53 |
| 5,559,584 A | * | 9/1996 | Miyaji et al. .................. 355/73 |
| 5,696,623 A | * | 12/1997 | Fujie et al. .................. 359/350 |
| 6,288,769 B1 | * | 9/2001 | Akagawa et al. ............. 355/30 |
| 6,341,006 B1 | * | 1/2002 | Murayama et al. ........... 355/53 |
| 6,451,507 B1 | * | 9/2002 | Suenaga et al. ............ 430/311 |
| 2003/0020888 A1 | * | 1/2003 | Tanaka et al. ................ 355/30 |

* cited by examiner

Primary Examiner—Henry Hung Nguyen
(74) Attorney, Agent, or Firm—Fitzpatrick, Cella, Harper & Scinto (57) ABSTRACT

An exposure apparatus for illuminating a reticle with exposing light from an exposing light source via a light-source lens system, and projecting a pattern, which has been formed on the reticle, onto a wafer via a projection lens system, thereby exposing the wafer to the pattern. The apparatus includes vessels for hermetically sealing the light-source lens system and the projection lens system disposed on the optical path of the exposing light from the exposing light source to the reticle, a gas supply unit for supplying the vessels with a specific gas, a vacuum source for evacuating the interior of the vessels, a vacuum-pressure controller for exercising control to hold the internal pressure of the vessels constant, and an escape valve for reducing the differential pressure between the internal pressure of the vessels and atmospheric pressure to a value below a predetermined pressure.

15 Claims, 6 Drawing Sheets

| | |
|---|---|
| URL | http://www.maintain.co.jp/db/input.html |

MALFUNCTION DATABASE INPUT SCREEN

DATE OF OCCURRENCE [2000/3/15] ~404
MODEL [*********] ~401
SUBJECT MATTER [OPERATING MALFUNCTION (ERROR AT BOOTING)] ~403
EQUIPMENT SERIAL NO. [465NS4580001] ~402
DEGREE OF URGENCY [D] ~405
CONDITION [LED CONTINUES FLASHING AFTER POWER IS TURNED ON] ~406
COUNTERMEASURE METHOD [POWER TURNED ON AGAIN (RED BUTTON PUSHED AT START UP)] ~407
PROGRESS REPORT [TEMPORARY MEASURES COMPLETED] ~408

[SEND] [RESET]

410 — LINK TO DATABASE OF RESULTS
411 — SOFTWARE LIBRARY
412 — OPERATING GUIDE

FIG. 5

FLOW OF SEMICONDUCTOR DEVICE MANUFACTURE

FIG. 6

EXPOSURE APPARATUS

FIELD OF THE INVENTION

This invention relates to an exposure apparatus in which the illuminating light is ultraviolet radiation or excimer laser light that has a particularly strong luminous flux and readily activates an atmospheric gas.

BACKGROUND OF THE INVENTION

An exposure apparatus used in the manufacture of semiconductors and the like is required to have higher throughput and resolution owing to much smaller pattern line width. This has been accompanied by the need for exposing light having ever higher illuminance. At the same time, the wavelength of the exposing light is becoming increasingly short.

However, it is known that exposing light causes impurities in the air to react photochemically with oxygen in an exposure apparatus that uses i lines (wavelength $\lambda$=365 nm) as the exposing light and in an exposure apparatus that uses exposing light, the wavelength of which is shorter than that of i lines. Such reaction products (fogging substances) attach themselves to glass members and produce an opaque fog on the glass members. A typical example of such a fogging substance is ammonium sulfate $(NH_4)_2SO_4$, which is produced by a reaction (oxidation) with oxygen in the air, if sulfur dioxide ($SO_2$) absorbs the energy of the exposing light and attains the excited state. The ammonium sulfate is white in color and results in fogging when it attaches itself to the surfaces of optical members such as lenses and mirrors. The exposing light is scattered and absorbed by the ammonium sulfate, as a consequence of which, there is a decline in the transmittance of the optical system.

In the region of short wavelengths in which the exposing light has a wavelength of less than 248 [nm], which is shorter than that of i lines, as in the case of a KrF excimer laser, the exposing light causes an even stronger photochemical reaction. As a result, not only does the above-mentioned fogging occur but so does a phenomenon in which the exposing light reacts with oxygen in the air to produce ozone, with both residual oxygen and the generated ozone absorbing the exposing light.

Accordingly, a method of preventing the contamination of optical members has been developed. The method involves placing the optical system, such as the lens of the light source or the projecting lens system, within a vessel and then replacing the air in the vessel with an inert gas such as nitrogen gas or with another gas from which impurities have been removed, whereby the aforementioned contamination is avoided.

In recent years, however, the illuminating systems of exposure apparatus have become increasingly complex in order to achieve diverse illuminating conditions and deformed illumination. As a consequence, maintenance is essential and the spaces filled with the inert gas frequently are exposed to the outside atmosphere whenever such maintenance is carried out. In addition, the inert gas used, such as nitrogen or helium, may have an influence upon the human body. This means that while maintenance is being performed, the supply of the inert gas must be stopped in order to assure safety. A consequence of this is that the interior of the vessel becomes filled with atmospheric air during maintenance work. After maintenance, the atmospheric air within the vessel must be replaced with inert gas again. Furthermore, if the exposure apparatus is out of action for a long period of time, it is likewise necessary for the inert gas to be substituted.

However, the areas filled with the inert gas inside the illuminating system and projecting lens system have become increasingly complex in structure and it is difficult for the inert gas to flow when the substitution is made from atmospheric air to the inert gas. Many points of stagnation result. Air accumulates at the stagnation points and the air accumulated at such points flows out only in small increments. As a consequence, the time needed for air within the vessel to be fully replaced with the inert gas is prolonged. The structure internally of the projecting lens system is particularly complicated and does not lend itself to the incorporation of a mechanism that prevents the accumulation of air within the vessel.

SUMMARY OF THE INVENTION

Accordingly, an object of the present invention is to provide an exposure apparatus in which the air within the vessel of an illuminating system and within the vessel of projection lenses can be replaced with an inert gas highly efficiently, thereby minimizing the time needed to make the substitution from atmospheric air to the inert gas.

According to the present invention, the foregoing object is attained by providing an exposure apparatus for illuminating a reticle with exposing light from an exposing light source via an illuminating optical system and projecting a pattern, which has been formed on the reticle, onto a substrate via a projection optical system, comprising: a first vessel within which the illuminating optical system is placed; a second vessel within which the projection optical system is placed; the first vessel having an inlet and an outlet for a first gas and the second vessel having an inlet and an outlet for a second gas; substitution means for substituting the first gas and/or the second gas for a gas in the interior of the first vessel and/or the second vessel; and exhaust means for evacuating the first vessel and/or the second vessel in order to establish negative pressure in the interior thereof when the first gas and/or the second gas is substituted for the gas in the interior of the first vessel and/or the second vessel.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENT

A preferred embodiment of the present invention will now be described in detail with reference to the drawings.

[Embodiment of Exposure Apparatus]

Figure 1:
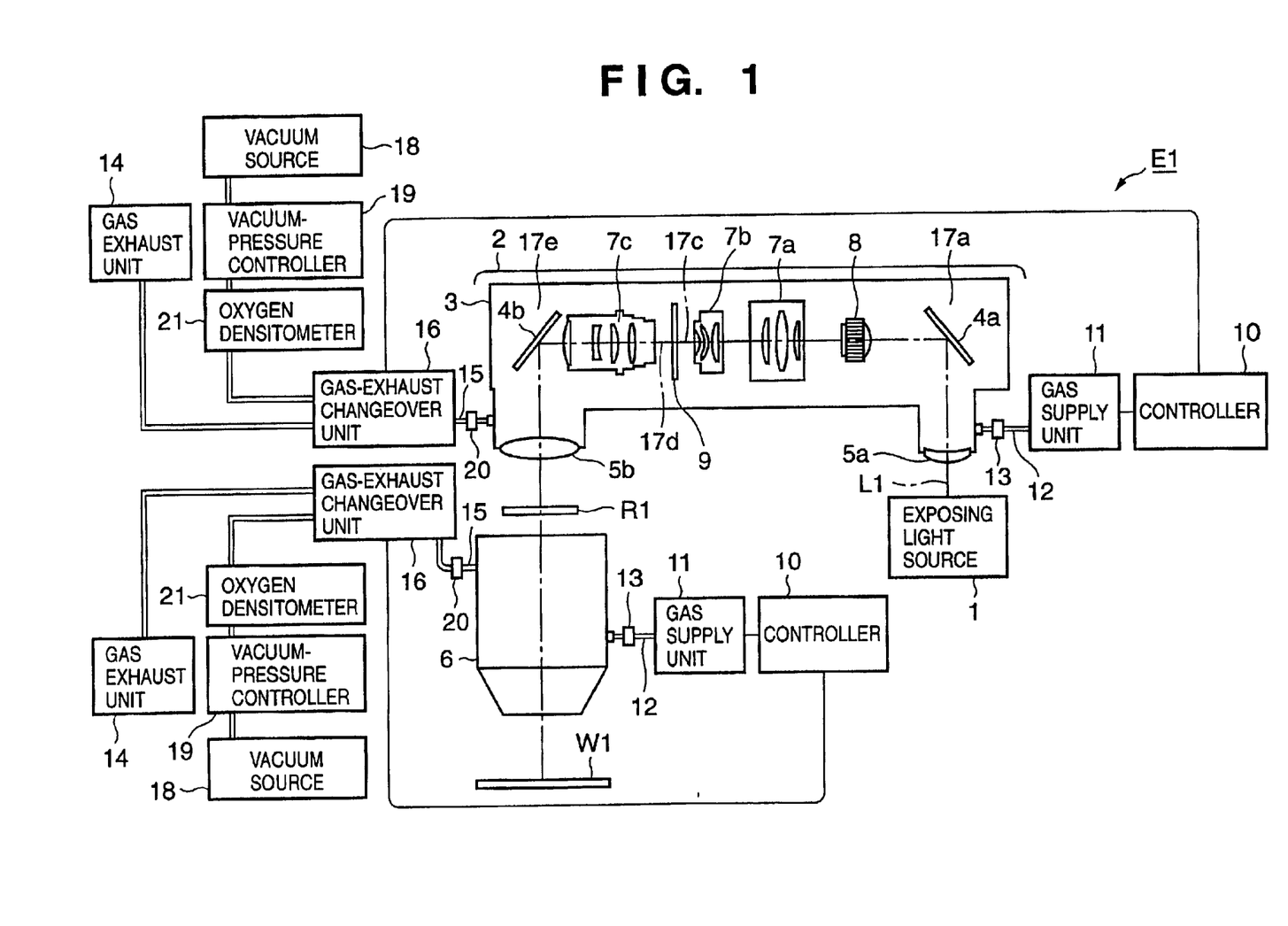
FIG. 1 is a schematic view illustrating the overall structure of an exposure apparatus according to an embodiment of the present invention.

FIG. 1 is a schematic view illustrating the overall structure of an exposure apparatus E1 according to an embodiment of the present invention.

The exposure apparatus E1 of this embodiment generally includes an exposing light source 1 comprising an excimer laser, a light source lens system 2 constituting illuminating optics for forming laser light L1, which is the illuminating light emitted from the exposing light source 1, into a luminous flux of a prescribed shape, and a projection lens system 6 constituting projection optics for forming the image of laser light L1, which has been formed into the prescribed shape by the light source lens system 2, onto a wafer (substrate) W1 via a reticle R1 serving as a mask.

The light source lens system 2 includes optical elements such as a number of lenses and mirrors 4a, 4b and illuminates, at a uniform illuminance, an illumination area on the reticle R1 with the laser light L1 from the exposing light source 1. The light source lens system 2 is constituted by collimator lenses 5a, 5b, a fly-eye lens 8 serving as an optical integrator, condenser lenses 7a, 7b, 7c, and a subunit such as a blind 9 for regulating the shape of the illumination area on the reticle R1.

The light source lens system 2 is placed inside a first vessel 3. The interior of the vessel 3 is connected to a gas supply unit 11, which supplies nitrogen gas serving as an inert gas (a first gas) from a gas inlet, via a gas supply line (piping) 12 and a solenoid valve 13 serving as a switch valve provided in the gas supply line 12.

A gas exhaust line (piping) 15 is connected to a gas outlet of the vessel 3. Connected to the gas exhaust line 15 is a gas-exhaust changeover unit 16 capable of switching between an evacuating mechanism, which comprises a vacuum source 18 for evacuating the vessel, a vacuum-pressure controller 19 and an oxygen densitometer 21, and an atmosphere-release mechanism comprising a gas exhaust (ventilation) unit 14. The gas-exhaust changeover unit 16 is capable of switching between the evacuating mechanism and the atmosphere-release mechanism automatically when the concentration of the gas in vessel 3 attains a predetermined concentration.

The timings at which the gas supply unit 11, gas-exhaust changeover unit 16 and gas exhaust unit 14 operate are decided by a program that has been stored in a controller 10.

During usual operation of the exposure apparatus, nitrogen gas is supplied while the pressure thereof is held constant in precise fashion by the gas supply line 12 and a flow-rate controller within the gas supply unit 11. Here the gas-exhaust changeover unit 16 switches over to the gas exhaust unit 14, which is on the atmosphere-release side, to thereby supply the nitrogen gas continuously or intermittently so that the air in the vessel 3 is constantly being replaced with the nitrogen gas.

An escape valve 20 capable effecting release to the atmosphere is provided in the gas exhaust line 15. If optical components have been installed, the escape valve 20 prevents any further rise in pressure when the differential pressure between the internal pressure at locations 17a, 17b, 17c, 17d and 17e, at which the nitrogen gas encounters difficulty in flowing, an atmospheric pressure exceeds a predetermined value. The vacuum source 18, which is connected to the vacuum-pressure controller 19, controls the internal pressure of the vessel 3 to hold the interior at a constant negative pressure (i.e., the internal pressure is capable of being regulated to a constant value). Further, the internal pressure may be varied at a suitable frequency by the vacuum-pressure controller 19 to generate pulsation.

Atmospheric air flows into the vessel 3 if the vessel is opened for maintenance or for some other reason. Further, when the exposure apparatus E1 is placed in operation again after having been opened, it is necessary to replace the atmospheric air in vessel 3 with inert gas again. In such a case, a changeover is made to the evacuation side by the gas-exhaust changeover unit 16 on the exhaust side to thereby evacuate the interior of the vessel 3. The internal pressure of the first vessel 3 is made a suitable negative pressure or is caused to pulsate at a negative pressure and is supplied with the gas from the gas supply unit 11.

The description rendered above deals with the components of the illumination system. However, similar effects can be obtained by a similar method applied to substitution (not shown) of gas such as inert gas within the lens vessel (a second vessel) in the projection lens system 6.

Further, similar effects can be obtained by a similar method applied to substitution (not shown) of gas such as inert gas within a wafer-stage space and reticle-stage space, etc., constructed as air-tight vessels (third and fourth vessels).

Thus, as described above, a forced flow of nitrogen gas is produced at the points 17a to 17e where the nitrogen does not readily flow and at points (not shown) where air accumulates within the projection lens system 6, thereby making it possible to rapidly eliminate accumulated atmospheric air.

It should be noted that the inert gas is not limited to nitrogen, and a gas such as helium may be used. Further, the gas is not limited to inert gas. It is permissible to use clean, dry air or a specific active gas (second gas) such as ozone for cleaning the optical members.

[Embodiment of Semiconductor Production System]

Described next will be an example of a system for producing semiconductor devices (semiconductor chips such as IC and LSI chips, liquid crystal panels, CCDs, thin-film magnetic heads and micromachines, etc.) utilizing the exposure apparatus described above. This system utilizes a computer network outside the semiconductor manufacturing plant to provide troubleshooting and regular maintenance of manufacturing equipment installed at the manufacturing plant and to furnish maintenance service such as the provision of software.

Figure 2:
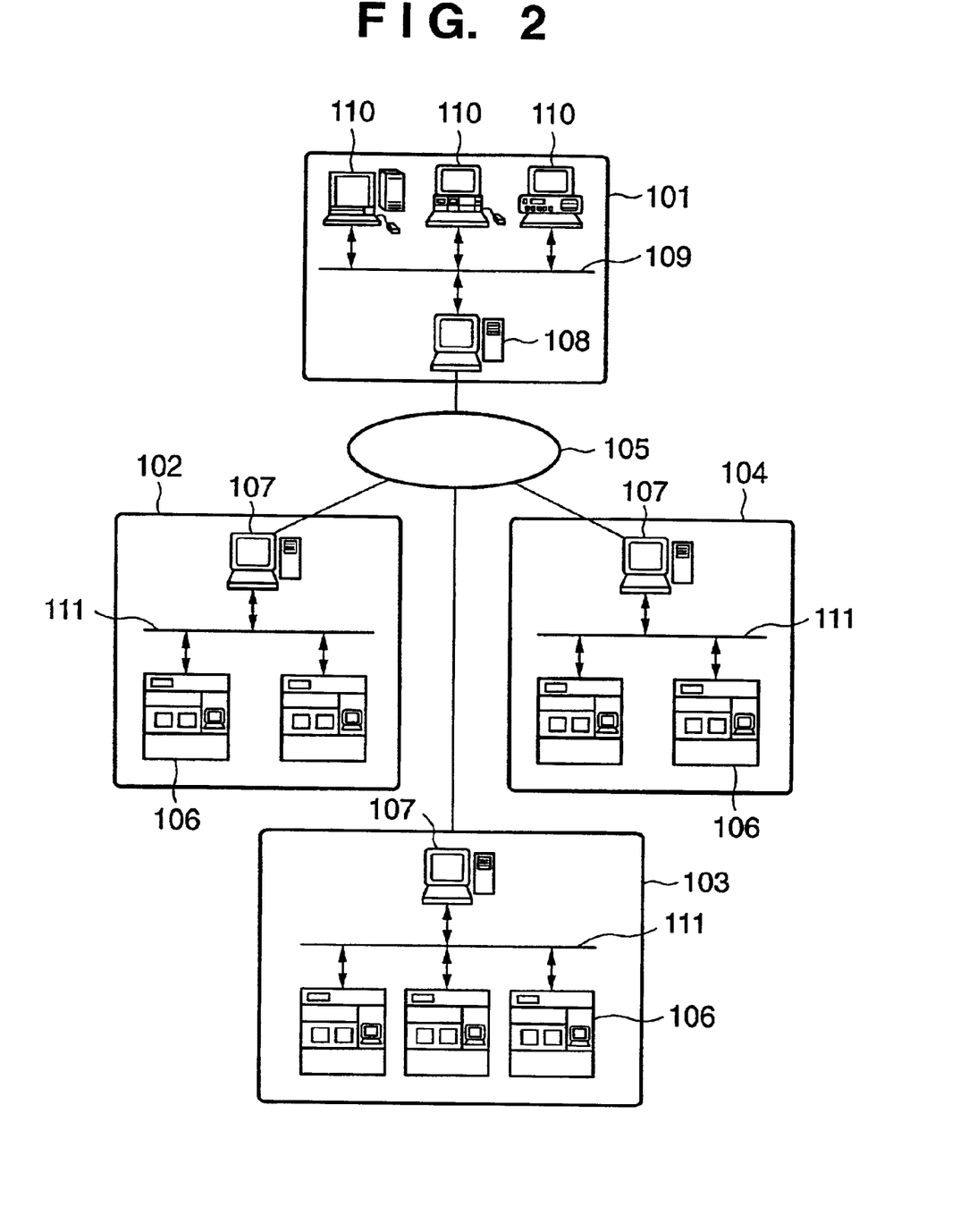
FIG. 2 is a conceptual view showing a semiconductor device production system, which includes the exposure apparatus of this embodiment, as seen from a certain angle.

FIG. 2 illustrates the overall system as seen from a certain angle. The system includes the business office 101 of the vendor (equipment supplier) that provides the equipment for manufacturing semiconductor devices. Semiconductor manufacturing equipment for performing various processes used in a semiconductor manufacturing plant is assumed to be the manufacturing equipment. Examples of the equipment are pre-treatment equipment (lithographic equipment such as exposure equipment, resist treatment equipment and etching equipment, heat treatment equipment, thin-film equipment and smoothing equipment, etc.) and post-treatment equipment (assembly equipment and inspection equipment, etc.). The business office 101 includes a host management system 108 for providing a manufacturing-equipment maintenance database, a plurality of control terminal computers 110, and a local-area network (LAN) 109 for connecting these components into an intranet. The host management system 108 has a gateway for connecting the LAN 109 to the Internet 105, which is a network external to the business office 101, and a security function for limiting access from the outside.

Numerals 102 to 104 denote manufacturing plants of semiconductor makers which are the users of the manufacturing equipment. The manufacturing plants 102 to 104 may be plants belonging to makers that differ from one another or plants belonging to the same maker (e.g., pre-treatment plants and post-treatment plants, etc.). Each of the plants 102 to 104 is provided with a plurality of pieces of manufacturing equipment 106, a local-area network (LAN) 111 which connects these pieces of equipment to construct an intranet, and a host management system 107 serving as a monitoring unit for monitoring the status of operation of each piece of manufacturing equipment 106. The host management system 107 provided at each of the plants 102 to 104 has a gateway for connecting the LAN 111 in each plant to the Internet 105 serving as the external network of the plants.

As a result, it is possible for the LAN of each plant to access the host management system 108 on the side of the vendor 101 via the Internet 105. By virtue of the security function of the host management system 108, users allowed to access the host management system 108 are limited. More specifically, status information (e.g., the condition of manufacturing equipment that has malfunctioned), which indicates the status of operation of each piece of manufacturing equipment 106, can be reported from the plant side to the vendor side. In addition, information in response to such notification (e.g., information specifying how to troubleshoot the problem, troubleshooting software and data, etc.), as well as the latest software and maintenance information such as help information, can be acquired from the vendor side.

A communication protocol (TCP/IP), which is used generally over the Internet, is employed for data communication between the plants 102~104 and the vendor 101 and for data communication over the LAN 111 within each plant. Instead of utilizing the Internet as the external network of a plant, it is also possible to utilize a highly secure leased-line network (ISDN, etc.) that cannot be accessed by a third party. Further, the host management system is not limited to that provided by a vendor, for an arrangement may be adopted in which the user constructs a database, places it on an external network and allows the database to be accessed from a number of plants that belong to the user.

Figure 3:
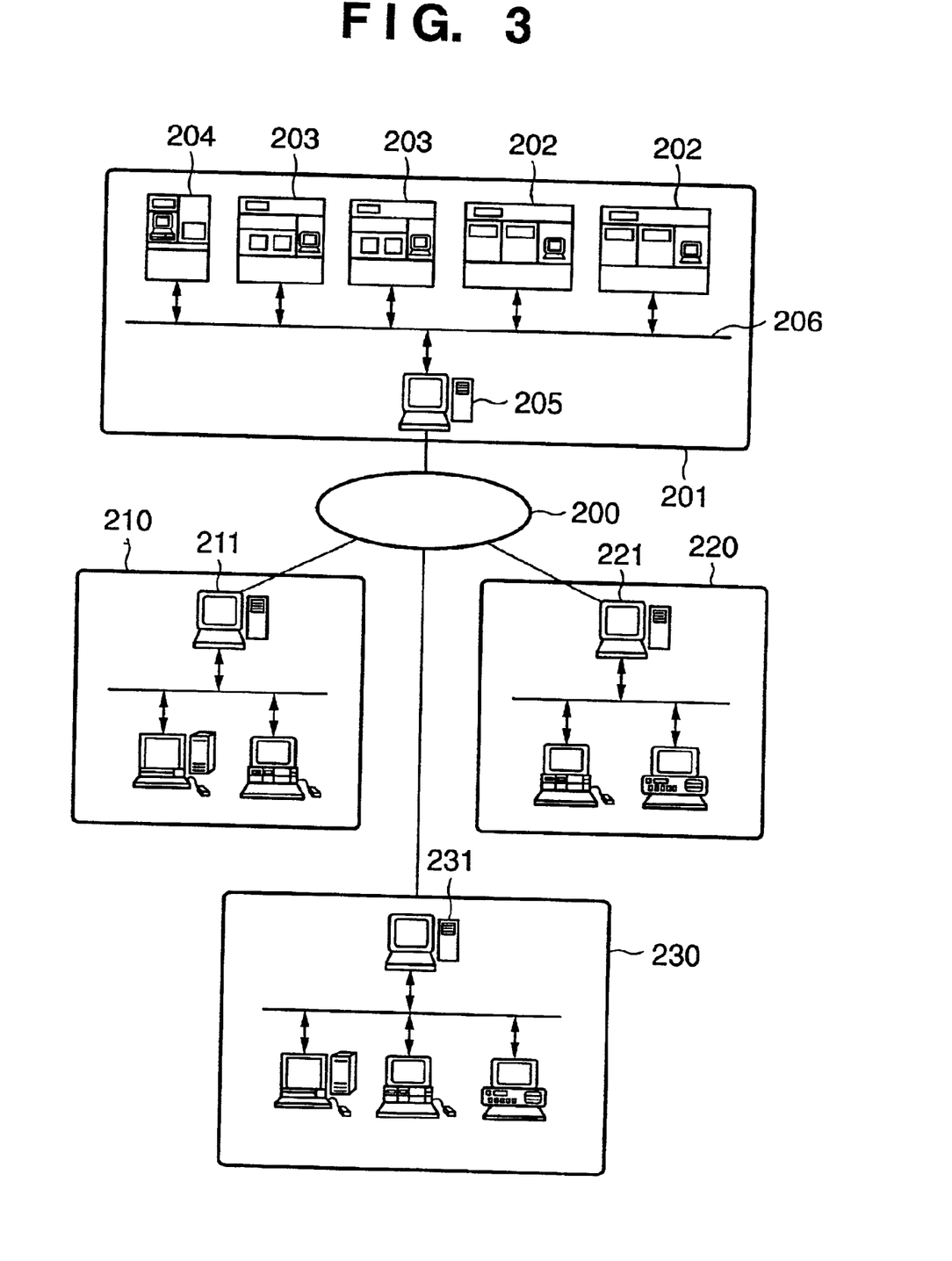
FIG. 3 is a conceptual view showing the semiconductor device production system, which includes the exposure apparatus of this embodiment, as seen from another angle.

FIG. 3 is a conceptual view illustrating the overall system of this embodiment as seen from an angle different from that depicted in FIG. 2. In the earlier example, a plurality of user plants each having manufacturing equipment are connected by an external network to the management system of the vendor that provided the manufacturing equipment, and information concerning the production management of each plant and information concerning at least one piece of manufacturing equipment is communicated by data communication via the external network.

In the example of FIG. 3, on the other hand, a plant having manufacturing equipment provided by a plurality of vendors is connected by an outside network to management systems of respective ones of the vendors of these plurality of pieces of manufacturing equipment, and maintenance information for each piece of manufacturing equipment is communicated by data communication. As shown in the drawing, the system includes a manufacturing plant 201 of the user of the manufacturing equipment (e.g., the maker of semiconductor devices). The manufacturing line of this plant includes manufacturing equipment for implementing a variety of processes. Examples of such equipment are exposure equipment 202, resist treatment equipment 203 and thin-film treatment equipment 204.

Though only one manufacturing plant 201 is shown in FIG. 3, in actuality, a plurality of these plants are networked in the same manner. The pieces of equipment in the plant are interconnected by a LAN 206 to construct an intranet and the operation of the manufacturing line is managed by a host management system 205. The business offices of vendors (equipment suppliers) such as an exposure equipment maker 210, resist treatment equipment maker 220 and thin-film treatment equipment maker 230 have host management systems 211, 221, 231, respectively, for remote maintenance of the equipment they have supplied. These have maintenance databases and gateways to the outside network, as described earlier.

The host management system 205 for managing each piece of equipment in the manufacturing plant of the user is connected to the management systems 211, 221, 231 of the vendors of these pieces of equipment by the Internet or leased-line network serving as an external network 200. If any of the series of equipment in the manufacturing line malfunctions, the line ceases operating. However, this can be dealt with rapidly by receiving remote maintenance from the vendor of the faulty equipment via the Internet 200, thereby making it possible to minimize line downtime.

Each piece of manufacturing equipment installed in the semiconductor manufacturing plant has a display, a network interface and a computer for executing network-access software and equipment operating software stored in a storage device. The storage device can be an internal memory or a hard disk or a network file server.

Figure 4:
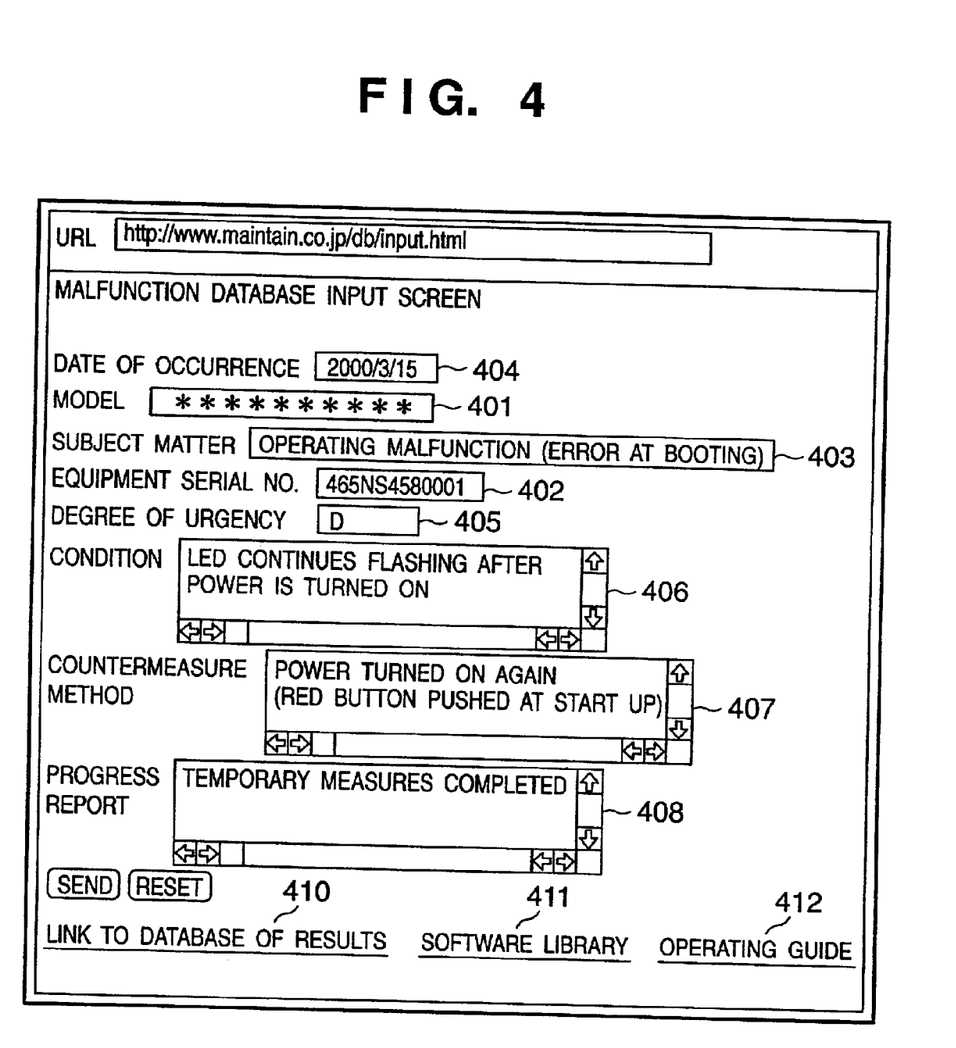
FIG. 4 shows a specific example of a user interface in the semiconductor device production system that includes the exposure apparatus of this embodiment.

The software for network access includes a special-purpose or general-purpose Web browser and presents a user interface, which has a screen of the kind shown by way of example in FIG. 4, on the display. The operator managing the manufacturing equipment at each plant enters information at the input items on the screen while observing the screen. The information includes model 401 of the manufacturing equipment, its serial number 402, subject matter 403 of the problem, its date of occurrence 404, degree of urgency 405, the particular condition 406, countermeasure method 407 and progress report 408.

The entered information is transmitted to the maintenance database via the Internet. The resulting appropriate maintenance information is sent back from the maintenance database and is presented on the display screen. The user interface provided by the Web browser implements hyperlink functions 410, 411, 412 as illustrated and enables the operator to access more detailed information for each item, to extract the latest version of software, which is used for the manufacturing equipment, from a software library provided by the vender, and to acquire an operating guide (help information) for reference by the plant operator.

Here the maintenance information provided by the maintenance database also includes the above-described information relating to the present invention, and the software library also provides the latest software for implementing the present invention.

Figure 5:
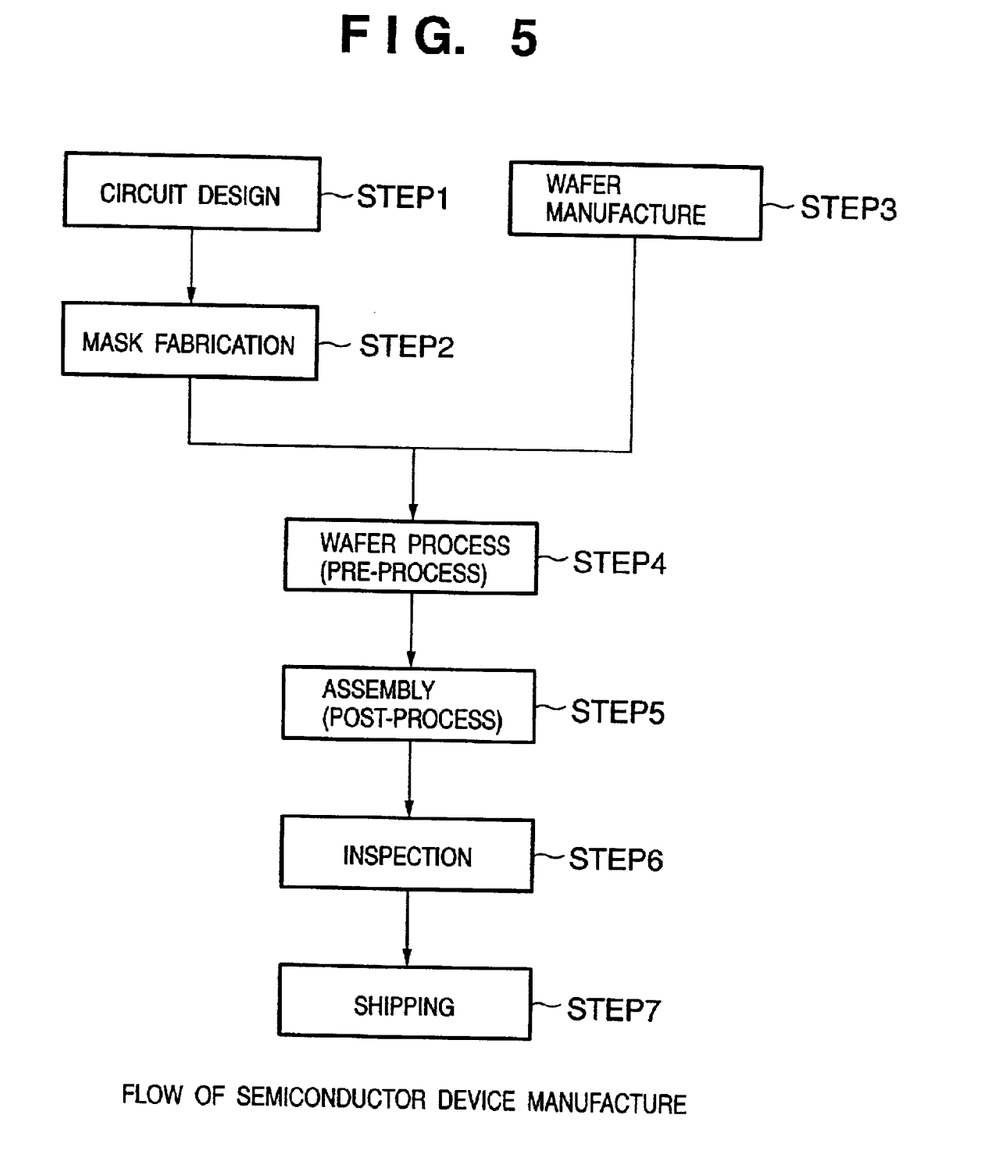
FIG. 5 is a diagram useful in describing the flow of a device manufacturing process that uses the exposure apparatus according to this embodiment.

A process for manufacturing a semiconductor device utilizing the production system set forth above will now be described. FIG. 5 illustrates the overall flow of a process for manufacturing semiconductor devices. The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as "pre-treatment".

A semiconductor chip is obtained, using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and a durability test at step 6 (inspection). The semiconductor device is completed through these steps and then is shipped (step 7). The pre- and post-treatments are performed at separate special-purpose plants. Maintenance is carried out on a per-plant basis by the above-described remote maintenance system. Further, information for production management and equipment maintenance is communicated by data communication between the pre- and post-treatment plants via the Internet or a leased-line network.

Figure 6:
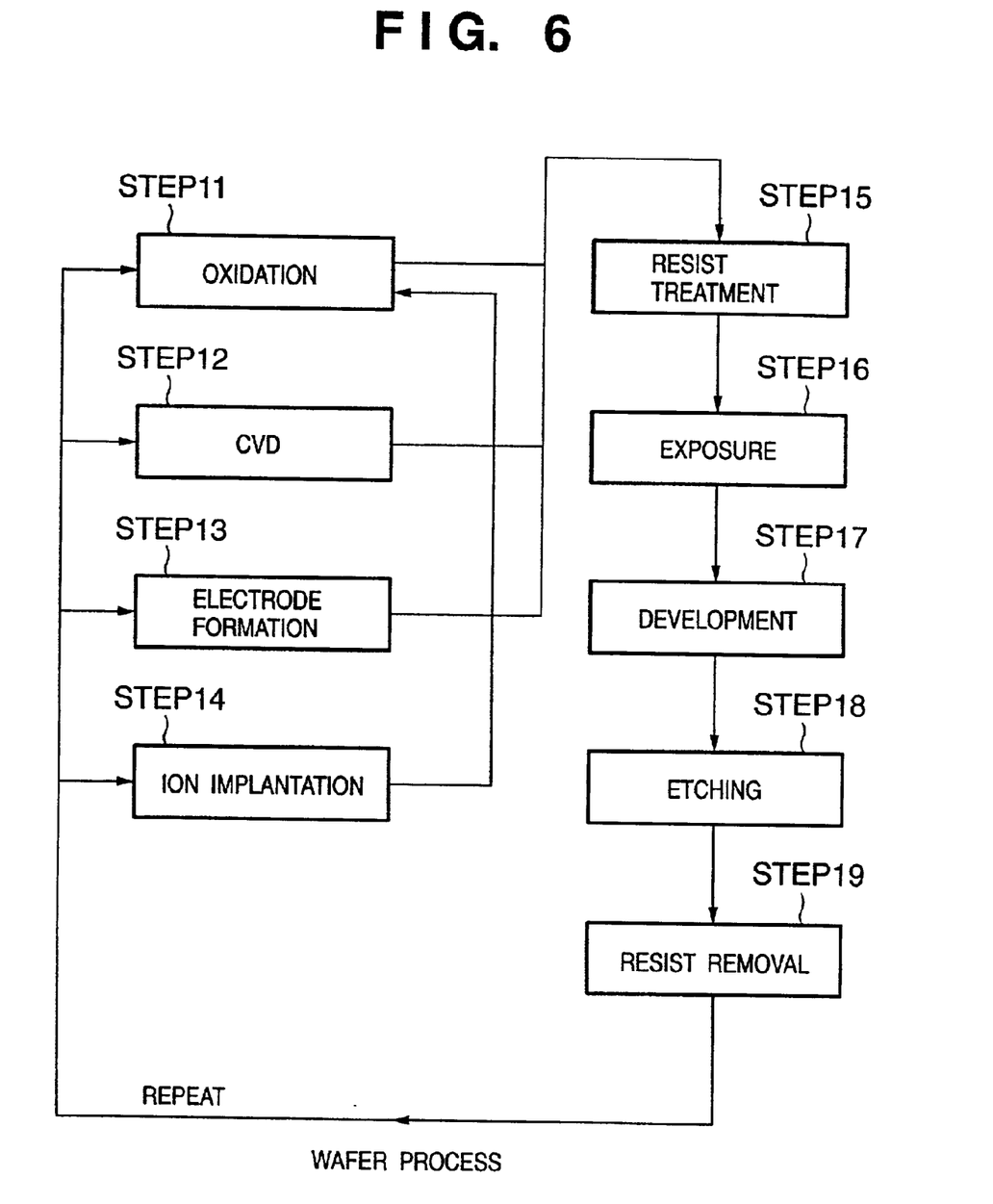
FIG. 6 is a diagram useful in describing a wafer process that uses the exposure apparatus according to this embodiment.

FIG. 6 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of semiconductor device manufacture can be improved over the prior art.

Thus, as described above, the present invention is such that when the atmospheric air in a vessel to be filled with an inert gas is replaced with the inert gas, the internal pressure of the vessel is held at negative pressure and the vessel is supplied with the inert gas, whereby the gases within the entire space internally of the vessel are mixed uniformly and discharged. As a result, reliable replacement with inert gas can be discharged in a short period of time without leaving any accumulated air. After the vessel filled with inert gas is exposed to the atmosphere for maintenance or the like, therefore, the replacement of the air inside the vessel with inert gas can be performed more rapidly (with higher efficiency), enabling the exposure apparatus to be restored to operation quickly. This makes it possible to minimize a decline in production.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for illuminating a reticle with exposing light from an exposing light source via an illuminating optical system and projecting a pattern, which has been formed on the reticle, onto a substrate via a projection optical system, said apparatus comprising:

a vessel within which one of the illumination optical system and the projection optical system is placed;

gas supplying means for supplying a desired gas to said vessel;

vacuum exhaust means for vacuum evacuating said vessel in order to establish negative pressure in the interior thereof from atmospheric pressure; and control means for controlling a differential pressure between an internal pressure of said vessel and the atmospheric pressure so as not to exceed a differential pressure constant, wherein said gas supplying means supplies the desired gas to said vessel after a pressure in said vessel is reached at a predetermined vacuum pressure by said vacuum exhaust means, and said vacuum exhaust means is atmosphere-released if a concentration of gas in said vessel attains a predetermined concentration.

2. The apparatus according to claim 1, wherein the desired gas is one of an inert gas and a specific active gas.

3. The apparatus according to claim 1, wherein said vacuum exhaust means comprises a vacuum source for creating a vacuum in said vessel, and a vacuum-pressure controller for controlling pressure within said vessel, wherein said vacuum-pressure controller is provided in piping leading from said vessel to said vacuum source.

4. The apparatus according to claim 1, further comprising a display, a network interface and a computer for running network software, wherein maintenance information relative to paid exposure apparatus is capable of being communicated via a computer network.

5. The apparatus according to claim 4, wherein the network software provides said display with a user interface for accessing a maintenance database, which is connected to an external network of a plant at which said exposure apparatus has been installed, and which is provided by a vendor or user of the exposure apparatus, thereby making it possible to obtain information from said database via said external network.

6. The apparatus according to claim 1, further comprising a pressure valve for preventing a differential pressure between the internal pressure of said vessel and the atmospheric pressure from exceeding a predetermined value.

7. The apparatus according to claim 6, wherein said pressure valve is a valve for atmosphere-releasing to reduce the internal pressure of said vessel.

8. A method of manufacturing a semiconductor device, said method comprising the steps of:

placing a group of manufacturing equipment, including an exposure apparatus for performing various processes, in a plant for manufacturing semiconductor devices; and manufacturing a semiconductor device by performing a plurality of processes using the group of manufacturing equipment, wherein the exposure apparatus includes:

a vessel within which one of an illuminating optical system and a projection optical system is placed;

gas supplying means for supplying a desired gas to the vessel;

vacuum exhaust means for vacuum evacuating the vessel in order to establish negative pressure in the interior thereof from atmospheric pressure; and control means for controlling a differential pressure between an internal pressure of the vessel and the atmospheric pressure so as not to exceed a differential pressure constant, wherein the gas supplying means supplies the desired gas to the vessel after a pressure in the vessel is reached at a predetermined vacuum pressure by the vacuum exhaust means, and the vacuum exhaust means is atmosphere-released if a concentration of gas in the vessel attains a predetermined concentration.

9. The method according to claim 8, further comprising:

interconnecting the group of manufacturing equipment by a local-area network; and communicating, by data communication, information relating to at least one piece of manufacturing equipment in the group thereof between the local-area network and an external network outside the plant.

10. The method according to claim 9, further comprising performing one of (i) obtaining maintenance information for the manufacturing equipment by accessing, by data communication via the external network, a database provided by a vendor or user of the exposure apparatus, and (ii) performing production management by data communication with a semiconductor manufacturing plant other than the first-mentioned semiconductor manufacturing plant via the external network.

11. A semiconductor manufacturing plant, comprising:

a group of manufacturing equipment, including an exposure apparatus, for performing various processes; and a gateway for making it possible to access, from a local-area network, an external network outside the plant, whereby information relating to at least one of the pieces of manufacturing equipment can be communicated by data communication, wherein said exposure apparatus includes:

a vessel within which one of an illumination optical system and a projection optical system is placed;

gas supplying means for supplying a desired gas to said vessel;

vacuum exhaust means for vacuum evacuating said vessel in order to establish negative pressure in the interior thereof from atmospheric pressure; and control means for controlling a differential pressure between an internal pressure of said vessel and the atmospheric pressure so as not to exceed a differential pressure constants, wherein said gas supplying means supplies the desired gas to said vessel after a pressure in said vessel is reached at a predetermined vacuum pressure by said vacuum exhaust means, and said vacuum exhaust means is atmosphere-released if a concentration of gas in said vessel attains a predetermined concentration.

12. A method of maintaining an exposure apparatus that has been installed in a semiconductor manufacturing plant, said method comprising the steps of:

providing a maintenance database, which is connected to an external network of the semiconductor manufacturing plant, by a vendor or user of the exposure apparatus;

allowing access to the maintenance database from within the semiconductor manufacturing plant via the external network; and transmitting maintenance information, which is stored in the maintenance database, to the outside of the semiconductor manufacturing plant via the external network, wherein the exposure apparatus includes:

a vessel within which one of an illuminating optical system and a projection optical system is placed;

gas supplying means for supplying a desired gas to the vessel;

vacuum exhaust means for vacuum evacuating the vessel in order to establish negative pressure in the interior thereof from atmospheric pressure; and control means for controlling a differential pressure between an internal pressure of the vessel and the atmospheric pressure so as not to exceed a differential pressure constant, wherein the gas supplying means supplies the desired gas to the vessel after a pressure in the vessel is reached at a predetermined vacuum pressure by the vacuum exhaust means, and the vacuum exhaust means is atmosphere-released if a concentration of gas in the vessel attains a predetermined concentration.

13. An exposure apparatus for illuminating a reticle with exposing light from an exposing light source via an illumination optical system and projecting a pattern, which has been formed on the reticle, onto a substrate via a projection optical system, said apparatus comprising:

a vessel within which one of the illuminating optical system and the projection optical system is placed;

gas supplying means for supplying a desired gas to said vessel; and vacuum exhaust means for vacuum evacuating said vessel in order to establish a negative pressure in the interior thereof from atmospheric pressure, wherein said vacuum exhaust means evacuates an internal pressure of said vessel to pulsate the internal pressure at a predetermined frequency in a range from negative pressure to atmospheric pressure.

14. An exposure method for illuminating a reticle with exposing light from an exposing light source via an illuminating optical system and projecting a pattern, which has been formed on the reticle, onto a substrate via a projection optical system, said method comprising:

a gas supplying step of supplying a desired gas to a vessel within which one of the illuminating optical system and the projection optical system is placed; and a control step of controlling a differential pressure between the internal pressure of the vessel and the atmosphere so as not to exceed a differential pressure constant when the vessel is vacuum evacuated in order to establish a negative pressure in the interior thereof from atmospheric pressure, wherein said gas supplying step supplies the desired gas to the vessel after a pressure in the vessel is reached at a predetermined vacuum pressure in said control step; and atmosphere-releasing the vessel using vacuum exhaust means if a concentration of gas in the vessel attains a predetermined concentration.

15. An exposure method for illuminating a reticle with exposing light from an exposing light source via an illuminating optical system and projecting a pattern, which has been formed on the reticle, onto a substrate via a projection optical system, said method comprising:

a gas supplying step of supplying a desired gas to a vessel within which one of the illuminating optical system and the projection optical system is placed; and an exhaust step of evacuating internal pressure of the vessel to pulsate the internal pressure at a predetermined frequency in a range from negative pressure to atmospheric pressure when the vessel is vacuum evacuated in order to establish a negative pressure in the interior thereof from atmospheric pressure.

* * * * *

UNITED STATES PATENT AND TRADEMARK OFFICE
CERTIFICATE OF CORRECTION

PATENT NO. : 6,778,255 B2
DATED : August 17, 2004
INVENTOR(S) : Masaru Ogata

It is certified that error appears in the above-identified patent and that said Letters Patent is hereby corrected as shown below:

Column 1,
Line 20, "365 nm)" should read -- 365 [nm]) --.

Column 9,
Line 4, "constants," should read -- constant, --.

Signed and Sealed this

Twenty-second Day of March, 2005

JON W. DUDAS
*Director of the United States Patent and Trademark Office*